United States Patent
Chen et al.

(10) Patent No.: US 10,922,261 B2
(45) Date of Patent: Feb. 16, 2021

(54) MEMORY CLOCK FREQUENCY ADJUSTING METHOD, MAINBOARD, AND COMPUTER OPERATING SYSTEM

(71) Applicant: GIGA-BYTE TECHNOLOGY CO., LTD., New Taipei (TW)

(72) Inventors: Cho-May Chen, New Taipei (TW); Hou-Yuan Lin, New Taipei (TW); Sheng-Liang Kao, New Taipei (TW)

(73) Assignee: GIGA-BYTE TECHNOLOGY CO., LTD., New Taipei (TW)

( * ) Notice: Subject to any disclaimer, the term of this patent is extended or adjusted under 35 U.S.C. 154(b) by 25 days.

(21) Appl. No.: 15/484,085

(22) Filed: Apr. 10, 2017

(65) Prior Publication Data

US 2018/0188770 A1   Jul. 5, 2018

(30) Foreign Application Priority Data

Dec. 30, 2016   (TW) .................................. 105144019

(51) Int. Cl.
*G06F 9/00*     (2006.01)
*G06F 15/177*   (2006.01)
(Continued)

(52) U.S. Cl.
CPC ........ *G06F 13/4234* (2013.01); *G06F 9/4403* (2013.01); *G11C 7/222* (2013.01);
(Continued)

(58) Field of Classification Search
CPC ........... G06F 9/44; G06F 13/4234; G06F 1/32
See application file for complete search history.

(56) References Cited

U.S. PATENT DOCUMENTS

| 7,213,140 B2 | 5/2007 | Wang |
| 7,287,199 B2 | 10/2007 | Chang |

(Continued)

FOREIGN PATENT DOCUMENTS

| TW | 445403 | 7/2001 |
| TW | 452697 | 9/2001 |

(Continued)

OTHER PUBLICATIONS

"Office Action of Taiwan Counterpart Application," dated Aug. 29, 2017, p. 1-p. 7, in which the listed references were cited.
(Continued)

*Primary Examiner* — Mohammed H Rehman
(74) *Attorney, Agent, or Firm* — JCIPRNET

(57) ABSTRACT

A memory clock frequency adjusting method suitable for a computer device is provided. The computer device includes a basic input output system (BIOS) and a memory. The memory clock frequency adjusting method includes following steps. A boot process of the computer device is executed, and the memory is operated at a memory clock frequency set by the BIOS. Whether the computer device is successfully booted is determined by the BIOS to decide whether the boot process of the computer device is to be re-executed. A setting of the memory clock frequency is adjusted by the BIOS when the computer device re-executes the boot process to lower the memory clock frequency, so that the memory is operated at the lowered memory clock frequency. In addition, a mainboard and a computer operating system applying the memory clock frequency adjusting method are also provided.

12 Claims, 3 Drawing Sheets

(51) Int. Cl.
*G06F 13/42* (2006.01)
*G06F 9/4401* (2018.01)
*G11C 8/18* (2006.01)
*G11C 7/22* (2006.01)
*G11C 29/02* (2006.01)

(52) U.S. Cl.
CPC .............. *G11C 8/18* (2013.01); *G11C 29/023* (2013.01); *G11C 29/028* (2013.01); *G06F 9/4406* (2013.01)

(56) References Cited

U.S. PATENT DOCUMENTS

| | | | | |
|---|---|---|---|---|
| 2006/0015781 | A1* | 1/2006 | Rothman | G06F 11/2028 714/100 |
| 2006/0220723 | A1* | 10/2006 | Chen | G06F 1/08 327/291 |
| 2007/0136544 | A1* | 6/2007 | Oda | G06F 13/4243 711/167 |
| 2010/0082967 | A1* | 4/2010 | Lo | G11C 29/50 713/2 |
| 2010/0146252 | A1* | 6/2010 | Chang | G06F 1/24 713/1 |
| 2011/0133793 | A1* | 6/2011 | Wheelock | H03K 21/38 327/115 |
| 2013/0179710 | A1* | 7/2013 | Chang | G06F 1/3287 713/322 |

FOREIGN PATENT DOCUMENTS

| | | |
|---|---|---|
| TW | 200411352 | 7/2004 |
| TW | 200639616 | 11/2006 |
| TW | I277859 | 4/2007 |
| TW | 201013686 | 4/2010 |
| TW | 201044168 | 12/2010 |
| TW | 201227209 | 7/2012 |
| TW | 201312314 | 3/2013 |
| TW | I553467 | 10/2016 |

OTHER PUBLICATIONS

"Office Action of Taiwan Counterpart Application", dated May 18, 2018, p. 1-p. 10.

* cited by examiner

MEMORY CLOCK FREQUENCY ADJUSTING METHOD, MAINBOARD, AND COMPUTER OPERATING SYSTEM

CROSS-REFERENCE TO RELATED APPLICATION

This application claims the priority benefit of Taiwan application serial no. 105144019, filed on Dec. 30, 2016. The entirety of the above-mentioned patent application is hereby incorporated by reference herein and made a part of this specification.

FIELD OF THE INVENTION

The invention relates to a clock frequency adjusting method. More specifically, the invention relates to a memory clock frequency adjusting method, a mainboard, and a computer operating system.

DESCRIPTION OF RELATED ART

In the technical field of computer equipment, a memory is an essential circuit element for a computer device. Whether a boot process of the computer device is successfully executed to enter an operating system (OS) may relate to whether the memory may be operated effectively. For instance, if a user attempts to reach a better efficiency when using the computer device, the memory is usually overclocked to exceed a default standard speed. Nevertheless, the memory may encounter an overclocking failure, and the computer device may not be booted successfully and fails to load the OS as a result. Alternatively, a new memory purchased by the user may be a defective product, such that the newly-purchased memory may not be operated at a standard memory clock frequency. Hence, in view of the foregoing, if the boot process of the conventional computer device is re-executed for several times but the computer device still fails to be booted, then the user has to manually set and restart the computer device and re-load the BIOS to set the memory clock frequency. The foregoing method is inconvenient for the user; what is more, after the user resets the memory clock frequency, the computer device may still not be booted successfully. Therefore, how the memory clock frequency is adjusted automatically for the computer device to be booted successfully is an important issue in the field.

SUMMARY OF THE INVENTION

The invention provides a memory clock frequency adjusting method, a main board, and a computer operating system for lowering a memory clock frequency automatically, and a computer device is able to execute a boot process as normal in a stable system.

In an embodiment of the invention, a memory clock frequency adjusting method suitable for a computer device is provided. The computer device includes a basic input output system (BIOS) and a memory. The memory clock frequency adjusting method includes following steps. A boot process of the computer device is executed, and the memory is operated at a memory clock frequency set by the BIOS. Whether the boot process of the computer device is to be re-executed is decided by the BIOS through determining whether the computer device is successfully booted. When the boot process is re-executed by the computer device, a setting of the memory clock frequency is adjusted by the BIOS to lower the memory clock frequency, such that the memory is operated at the lowered memory clock frequency.

In an embodiment of the invention, the step of adjusting the setting of the memory clock frequency through the BIOS to lower the memory clock frequency includes the following. The memory clock frequency is lowered by the BIOS according to a default frequency adjusting range.

In an embodiment of the invention, the step of adjusting the setting of the memory clock frequency through the BIOS to lower the memory clock frequency includes the following. The lowered memory clock frequency is determined by the BIOS according to at least one of an operating voltage, a row address strobe-to-column address strobe delay (RAS-to-CAS delay, tRCD), a column address strobe latency (CAS latency), and a slew rate of the memory.

In an embodiment of the invention, the step of adjusting the setting of the memory clock frequency through the BIOS to lower the memory clock frequency includes the following. The memory clock frequency is lowered to a default memory clock frequency of a minimum threshold by the BIOS.

In an embodiment of the invention, the default memory clock frequency of the minimum threshold is lower than a standard memory clock frequency recorded in a serial presence detect (SPD) of the memory.

In an embodiment of the invention, a mainboard including a BIOS, a processor, and a memory is provided. The processor is coupled to the BIOS, and the BIOS is executed by the processor when a boot process is executed. The memory is coupled to the processor, and the memory is operated at a memory clock frequency set by the BIOS when the boot process is executed. Whether the boot process is successful is determined by the BIOS to decide whether the boot process is to be re-executed. If the boot process is re-executed, a setting of the memory clock frequency is adjusted by the BIOS to lower the memory clock frequency, such the memory is operated at the lowered memory clock frequency.

In an embodiment of the invention, the memory clock frequency is lowered by the BIOS according to a default frequency adjusting range.

In an embodiment of the invention, the lowered memory clock frequency is determined by the BIOS according to at least one of an operating voltage, a tRCD, a CAS latency, and a slew rate of the memory.

In an embodiment of the invention, the memory clock frequency is lowered to a memory clock frequency of a minimum threshold by the BIOS.

In an embodiment of the invention, the default memory clock frequency of the minimum threshold is lower than a standard memory clock frequency recorded in a SPD of the memory.

In an embodiment of the invention, a computer operating system including a computer device, a BIOS, a processor, and a memory is provided. The computer device is configured to execute a boot process. The BIOS is disposed in the computer device. The processor is coupled to the BIOS. The BIOS is executed by the processor when the boot process is executed by the computer device. When the boot process is executed by the computer device, the memory is operated at a memory clock frequency set by the BIOS. Whether the boot process of the computer device is successful is determined by the BIOS to decide whether the boot process of the computer device is to be re-executed. When the boot process is re-executed, a setting of the memory clock frequency is adjusted by the BIOS to lower the memory clock frequency, such that the memory is operated at the lowered memory clock frequency.

In an embodiment of the invention, the memory clock frequency is lowered by the BIOS according to a default frequency adjusting range.

In an embodiment of the invention, the lowered memory clock frequency is determined by the BIOS according to at least one of an operating voltage, a tRCD, a CAS latency, and a slew rate of the memory.

In an embodiment of the invention, the memory clock frequency is lowered to a memory clock frequency of a minimum threshold by the BIOS.

In an embodiment of the invention, the default memory clock frequency of the minimum threshold is lower than a standard memory clock frequency recorded in a SPD of the memory.

In view of the foregoing, in the memory clock frequency adjusting method, the mainboard, and the computer device provided in the embodiments of the invention, whether to lower the memory clock frequency of the memory and to re-execute the boot process are decided according to the determination on whether the computer device is successfully booted and loads an operating system (OS) or whether a system is stable. Therefore, after the computer device is re-started, the memory may be operated at a lower memory clock frequency.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Several embodiments are described below to illustrate the invention, but the invention is not limited to the embodiments illustrated herein. Applicable combinations among the embodiments are also permitted. Moreover, the term "coupled to" used throughout the embodiments (including claim) may refer to any direct and indirect connection means. For example, if a first device is described as being coupled to a second device in the embodiments, the sentence should be explained as the first device may be connected to the second device directly, or the first device may, through any other device or through certain connection means, be connected to the second device indirectly.

Figure 1:
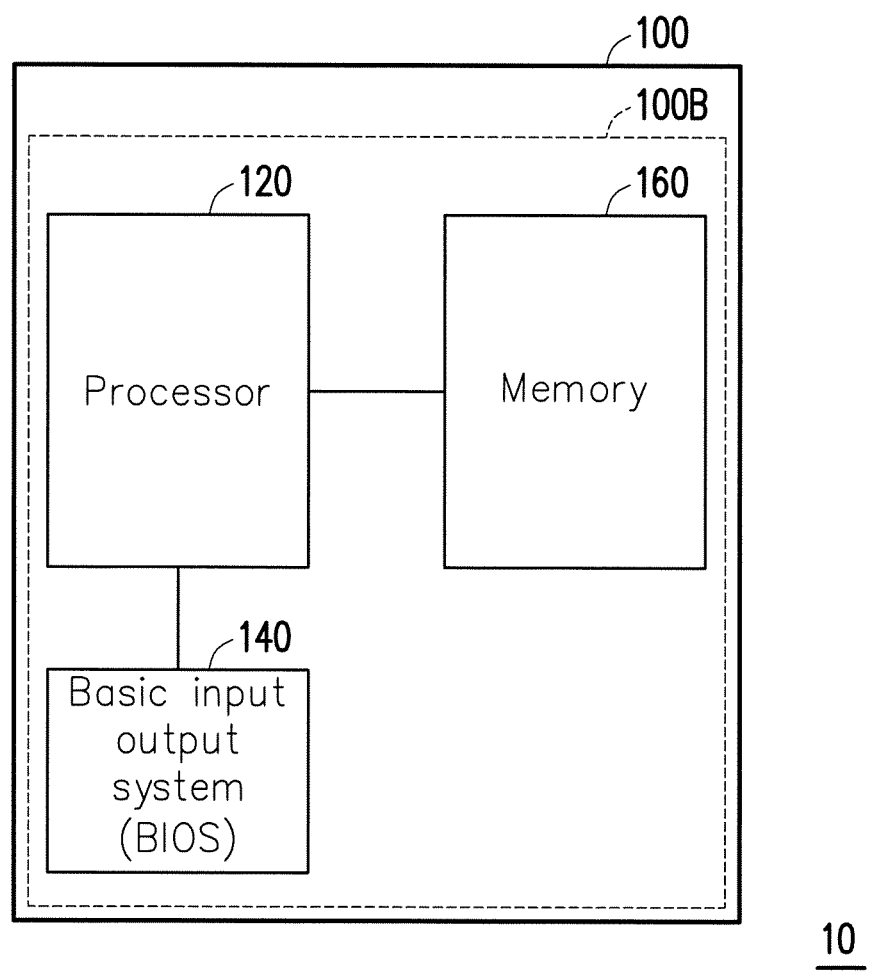
FIG. 1 is a schematic diagram illustrating a computer device according to an embodiment of the invention.

FIG. 1 is a schematic diagram illustrating a computer device according to an embodiment of the invention. Referring to FIG. 1, a computer operating system 10 includes a computer device 100. The computer device 100 includes a mainboard 100B, and a basic input output system (BIOS) 140 may be disposed on the mainboard 100B in advance. In the embodiment, a processor 120 may be disposed on the mainboard 100B through a central processing unit socket (CPU socket). A memory 160 may be disposed on the mainboard 100B through a memory socket. In other words, the mainboard 100B may include the processor 120, the BIOS 140, and the memory 160. The processor 120 is coupled to the BIOS 140 and the memory 160. In the embodiment, the BIOS 140 has a function of setting up a memory clock frequency of the memory 160. When a boot process is run by the computer device 100, the BIOS 140 is executed, and the memory 160 is operated by the computer device 100 according to the memory clock frequency set by the BIOS 140.

In the embodiment, if the computer device 100 fails to be booted or fails to load an OS (operating system), the boot process is then restarted, and the computer device 100 re-loads the BIOS 140. Nevertheless, the failure to boot the computer device 100 may be caused by the inability of the memory 160 to operate effectively, such that the computer device 100 is unable to be booted normally. In other words, the memory 160 may not be able to operate at the memory clock frequency originally set by the BIOS 140. Hence, in the embodiment, the memory clock frequency is reset by the BIOS 140 after a restart, such that the memory 160 is operated at a lower memory clock frequency after the restart. Here, the restart process refers to a re-execution of the boot process. In other words, the memory clock frequency of the memory 160 may be adjusted automatically by the computer device 100 according to the embodiment.

In the embodiment, the computer device 100 may be a device with computing capabilities, such as a personal computer, a notebook computer, or a tablet computer. The computer device 100 may include the mainboard 100B, and the processor 120, the BIOS 140, and the memory 160 may be disposed on the mainboard 100B. In the embodiment, the processor 120 may be a central processing unit (CPU). The BIOS 140 may be stored in a storage device in advance. The storage device may be a flash memory and be disposed on the mainboard 100B in advance. In the embodiment, the memory 160 may be a dynamic random access memory (DRAM), such as a synchronous dynamic random-access memory (SDRAM), a double-data-rate two SDRAM (DDR2 SDRAM), a double-data-rate three SDRAM (DDR3 SDRAM), or a double-data-rate four SDRAM (DDR4 SDRAM). The invention is not intended to limit the type of the memory 160.

Figure 2:
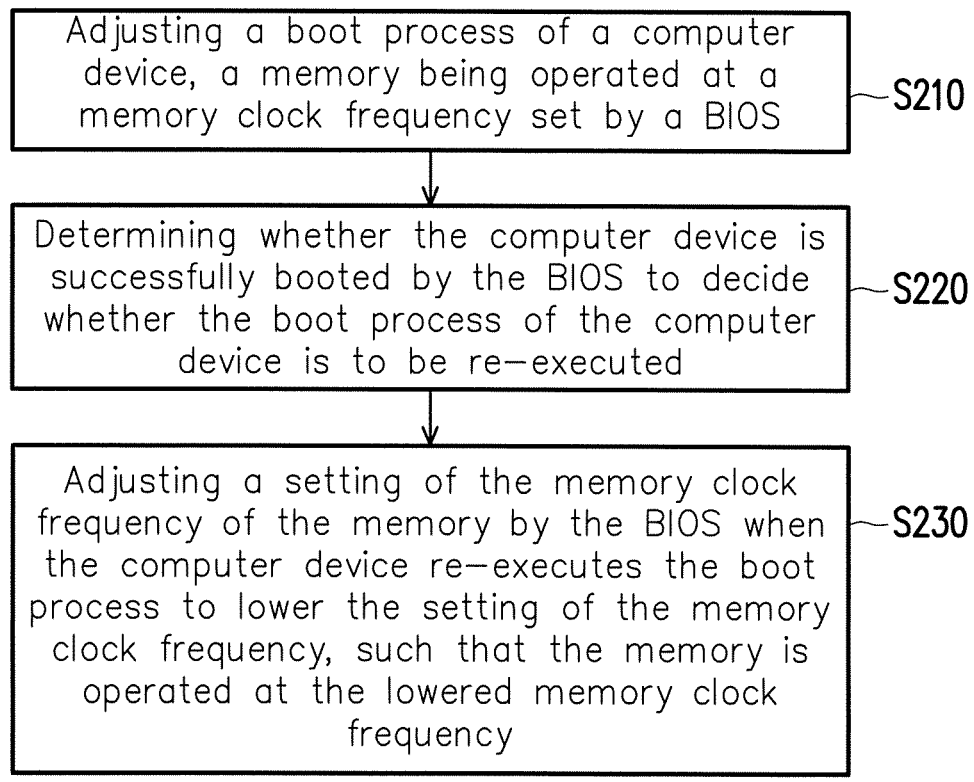
FIG. 2 is a flow chart illustrating a memory clock frequency adjusting method according to an embodiment of the invention.

FIG. 2 is a flow chart illustrating a memory clock frequency adjusting method according to an embodiment of the invention. Referring to FIG. 1 and FIG. 2, the memory clock frequency adjusting method provided by the embodiment may at least be applicable to the computer device 100 in FIG. 1. The memory clock frequency adjusting method provided by the embodiment includes the following steps. First, in step S210, the boot process of the computer device 100 is executed by the processor 120, and the memory 160 is operated at the memory clock frequency set by the BIOS 140. Next, in step S220, whether the computer device 100 is successfully booted is determined by the BIOS 140 to decide whether the boot process of the computer device is to be re-executed. In step S230, if the boot process is re-executed by the computer device 100, a setting of the memory clock frequency of the memory 160 is adjusted by the BIOS 140 to lower the memory clock frequency, such that the memory 160 is operated at the lowered memory clock frequency. In other words, since the memory 160 may be operated at a memory clock frequency that is not executed effectively, if the computer device 100 fails to be booted successfully, the memory clock frequency is automatically adjusted by the BIOS 140 according to the embodiment, such that the memory 160 is operated at the lowered memory clock frequency during the next boot process. That is to say, in this embodiment, the memory clock frequency may be automatically adjusted by the computer device 100 in response to the actual working efficiency of the memory 160.

By the way, in this embodiment, the situation that the computer device is successfully booted is that the computer device 100 operate stably, and the OS is activated, so that users can manipulate it, and a system crash or a damage to other computer devices are prevented from occurring.

Figure 3:
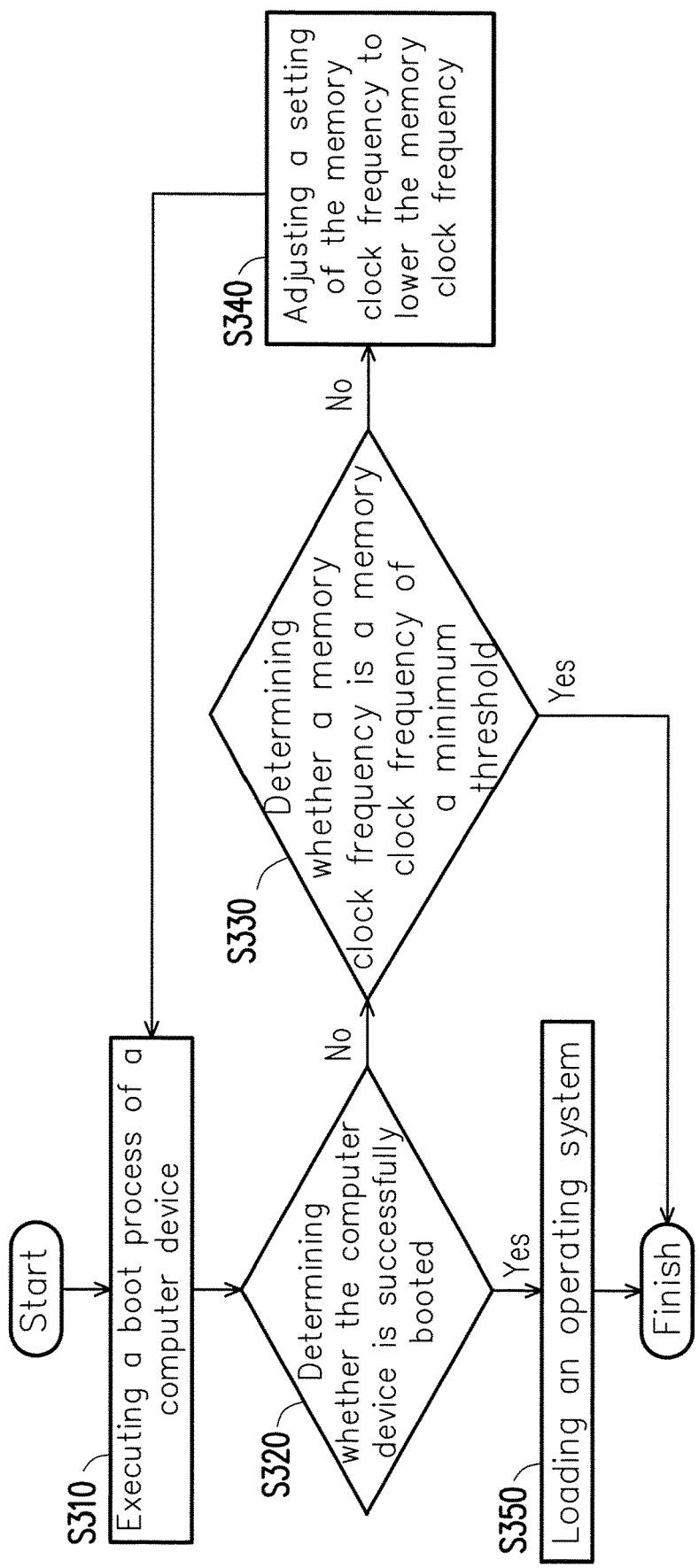
FIG. 3 is a flow chart illustrating a memory clock frequency adjusting method according to another embodiment of the invention.

In order to make people having ordinary skills in the art understand an adjusting means of the memory clock frequency provided by the embodiment of the invention, another embodiment is described below. FIG. 3 is a flow chart illustrating a memory clock frequency adjusting method according to another embodiment of the invention. Referring to FIG. 1 and FIG. 3, the memory clock frequency adjusting method provided by the embodiment may at least be applicable to the computer device 100 in FIG. 1. In step S310, the boot process of the computer device 100 is executed by the processor 120, and the memory 160 is operated at the memory clock frequency set by the BIOS 140. It is worth noting that in the embodiment, the memory clock frequency set by the BIOS 140 may be a standard memory clock frequency recorded in a serial presence detect (SPD) of the memory 160, or a memory clock frequency set by the user in the BIOS 140. The invention is not intended to limit the type of the memory clock frequency. The standard memory clock frequency refers to a memory clock frequency with a default setting. In other words, the memory clock frequency adjusting method provided by the embodiment may be applied to an operating scenario of the memory 160 operating in a general operation mode, an underclocking mode, or an overclocking mode. In the embodiment of the invention, regardless of the memory clock frequency originally set by the BIOS 140, the BIOS 140 may automatically decide whether to execute the underclocking of the memory according to whether the boot process is successful in the stable system.

In step S320, whether the computer device 100 is successfully booted in the stable system is determined by the BIOS 140. In step S350, if the computer system is booted successfully, the computer device 100 loads the OS. On the contrary, in step S330, if the computer device 100 fails to be booted successfully, whether the memory clock frequency is a memory clock frequency of a minimum threshold may first be determined by the BIOS 140. In the embodiment, the memory clock frequency of the minimum threshold refers to the lowest clock frequency at which the memory 160 may be operated; for example, the lowest operable clock frequency for the DDR3 is 800 MHz, or the lowest operable clock frequency for the DDR4 is 2133 MHz. It thus can be seen that the memory clock frequency of the minimum threshold is lower than the standard memory clock frequency, but the invention is not limited thereto. In an embodiment, the memory clock frequency of the minimum threshold may be determined according to the specification of the memory 160 or may be preset by the user. That is, if the memory 160 has already been operated at the lowest clock frequency in a previous boot, but the computer device 100 still fails to be booted successfully, the setting of the memory clock frequency is not to be further lowered by the BIOS 140. In other words, if the memory 160 is operated at the lowest clock frequency, but the computer device 100 still fails to be booted successfully, the memory 160 may be damaged, or the reason preventing the computer device 100 from being booted successfully is not associated with the memory 160. Hence, the BIOS 140 stops adjusting the memory clock frequency or stops executing the boot process.

In step S340, since the memory 160 is not operated at the memory clock frequency of the minimum threshold in the previous boot, the setting of the memory clock frequency is adjusted by the BIOS 140 to lower the memory clock frequency, and the boot process of the computer device 100 is re-executed. In other words, in the embodiment, if the computer device 100 fails to be booted successfully, the memory clock frequency may be continuously lowered by the BIOS 140 until the computer device 100 is successfully booted or the memory clock frequency is lowered to the memory clock frequency of the minimum threshold.

It is worth noting that in the embodiment, the memory clock frequency may be lowered by the BIOS 140 according to a default frequency adjusting range. For example, a stable frequency value that may be supported by the memory 160 is automatically found through lowering the frequency by a default value, e.g., 20, 30, or 40 MHz each time. Alternately, a lowered range of the memory clock frequency may be calculated or estimated by the BIOS 140 according to at least one of an operating voltage, a row address strobe-to-column address strobe delay (RAS-to-CAS delay, tRCD), a column address strobe latency (CAS latency), and a slew rate of the memory 160, so as to obtain a lowered memory clock frequency. However, the invention is not limited thereto. In an embodiment, the lowered range of the memory clock frequency may also be calculated by the BIOS 140 according to operating conditions of the processor 120 or other system elements. In other words, the BIOS 140 provided by the embodiment may further include an operational program or an algorithm used for calculating the memory clock frequency. When the computer device 100 fails to be booted successfully, the required lowered range of the memory clock frequency or a value of the lowered memory clock frequency may be calculated or estimated by the BIOS 140, such that the restarted memory 160 may be operated at a suitable memory clock frequency.

To sum up, in the memory clock frequency adjusting method and the computer device provided by the embodiments of the invention, whether to lower the memory clock frequency by the BIOS and to re-execute the boot process are determined according to whether the computer device is successfully booted in the stable system and loads the OS. In other words, the BIOS provided by the embodiments of the invention may correspondingly underclock the memory clock frequency of the memory automatically according to whether the computer device is restarted. Moreover, in the memory clock frequency adjusting method and the computer device provided by the embodiments of the invention, the lowered memory clock frequency may be determined according to a calculated or default lowered frequency, such that the underclocking of the memory is implemented effectively.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A memory clock frequency adjusting method, suitable for a computer device comprising a basic input output system and a memory, wherein the memory clock frequency adjusting method comprises:
    executing a boot process of the computer device, the memory being operated at a standard memory clock frequency recorded in a serial presence detect of the memory and set by the basic input output system;
    determining whether the computer device is successfully booted by the basic input output system to decide whether to re-execute the boot process of the computer device; and
    adjusting a setting of the memory clock frequency by the basic input output system if the computer device re-executes the boot process to lower the memory clock frequency, such that the memory is operated at the lowered memory clock frequency,
    wherein the step of adjusting the setting of the memory clock frequency by the basic input output system to lower the memory clock frequency comprises:
        determining whether the memory clock frequency is a default memory clock frequency of a minimum threshold;
        when the memory clock frequency is the default memory clock frequency of the minimum threshold, the basic input output system stops adjusting the memory clock frequency; and
        when the memory clock frequency is not the default memory clock frequency of the minimum threshold, the basic input output system lowers the memory clock frequency according to a default frequency adjusting range multiple times to re-execute the boot process of the computer device multiple times until the computer device is successfully booted,
    wherein the default memory clock frequency of the minimum threshold is lower than the standard memory clock frequency recorded in the serial presence detect of the memory, and the default memory clock frequency of the minimum threshold is a lowest memory clock frequency at which the memory is capable of being operated.

2. The memory clock frequency adjusting method as claimed in claim 1, wherein the step of adjusting the setting of the memory clock frequency by the basic input output system to lower the memory clock frequency further comprises:
    determining the lowered memory clock frequency by the basic input output system according to at least one of an operating voltage, a row address strobe-to-column address strobe delay, a column address strobe latency, and a slew rate of the memory.

3. The memory clock frequency adjusting method as claimed in claim 1, wherein when the memory clock frequency is not the default memory clock frequency of the minimum threshold, the basic input output system lowers the memory clock frequency to re-execute the boot process of the computer device comprises:
    lowering the memory clock frequency to the default memory clock frequency of a minimum threshold by the basic input output system.

4. The memory clock frequency adjusting method as claimed in claim 3, wherein the default memory clock frequency of the minimum threshold is lower than the standard memory clock frequency recorded in the serial presence detect of the memory.

5. A mainboard, comprising:
    a basic input output system;
    a processor, coupled to the basic input output system, the processor executing the basic input output system when a boot process is executed; and
    a memory, coupled to the processor, the memory being operated at a standard memory clock frequency recorded in a serial presence detect of the memory and set by the basic input output system when the boot process is executed,
    wherein the basic input output system determines whether the boot process is successful to decide whether the boot process is to be re-executed, and if the boot process is to be re-executed, the basic input output system adjusts a setting of the memory clock frequency to lower the memory clock frequency, such that the memory is operated at the lowered memory clock frequency,
    wherein the basic input output system adjusts the setting of the memory clock frequency to lower the memory clock frequency comprises:
        the basic input output system determines whether the memory clock frequency is a default memory clock frequency of a minimum threshold;
        when the memory clock frequency is the default memory clock frequency of the minimum threshold, the basic input output system stops adjusting the memory clock frequency; and
        when the memory clock frequency is not the default memory clock frequency of the minimum threshold, the basic input output system lowers the memory clock frequency according to a default frequency adjusting range multiple times to re-execute the boot process multiple times until a computer device is successfully booted,
    wherein the default memory clock frequency of the minimum threshold is lower than the standard memory clock frequency recorded in the serial presence detect of the memory, and the default memory clock frequency of the minimum threshold is a lowest memory clock frequency at which the memory is capable of being operated.

6. The mainboard as claimed in claim 5, wherein the basic input output system determines the lowered memory clock frequency according to at least one of an operating voltage, a row address strobe-to-column address strobe delay, a column address strobe latency, and a slew rate of the memory.

7. The mainboard as claimed in claim 5, wherein the basic input output system lowers the memory clock frequency to the default memory clock frequency of a minimum threshold.

8. The mainboard as claimed in claim 7, wherein the default memory clock frequency of the minimum threshold is lower than the standard memory clock frequency recorded in the serial presence detect of the memory.

9. A computer operating system, comprising:
    a computer device, configured to execute a boot process;
    a basic input output system, disposed in the computer device;
    a processor, coupled to the basic input output system, the processor executing the basic input output system when the computer device executes the boot process; and
    a memory, coupled to the processor, the memory being operated at a standard memory clock frequency recorded in a serial presence detect of the memory and set by the basic input output system when the computer device executes the boot process, wherein the basic input output system determines whether the computer device is successfully booted to decide whether to re-execute the boot process of the computer device, and if the boot process is re-executed, the basic input output system adjusts a setting of the memory clock frequency to lower the memory clock frequency, such that the memory is operated at the lowered memory clock frequency, wherein the basic input output system adjusts a setting of the memory clock frequency to lower the memory clock frequency comprises:
  the basic input output system determines whether the memory clock frequency is a default memory clock frequency of a minimum threshold;
  when the memory clock frequency is the default memory clock frequency of the minimum threshold, the basic input output system stops adjusting the memory clock frequency; and
  when the memory clock frequency is not the default memory clock frequency of the minimum threshold, the basic input output system lowers the memory clock frequency according to a default frequency adjusting range multiple times to re-execute the boot process of the computer device multiple times until a computer device is successfully booted, wherein the default memory clock frequency of the minimum threshold is lower than the standard memory clock frequency recorded in the serial presence detect of the memory, and the default memory clock frequency of the minimum threshold is a lowest memory clock frequency at which the memory is capable of being operated.

10. The computer operating system as claimed in claim 9, wherein the basic input output system determines the lowered memory clock frequency according to at least one of an operating voltage, a row address strobe-to-column address strobe delay, a column address strobe latency, and a slew rate of the memory.

11. The computer operating system as claimed in claim 9, wherein the basic input output system lowers the memory clock frequency to the default memory clock frequency of a minimum threshold.

12. The computer operating system as claimed in claim 11, wherein the default memory clock frequency of the minimum threshold is lower than the standard memory clock frequency recorded in the serial presence detect of the memory.

* * * * *